(12) United States Patent
Hirai et al.

(10) Patent No.: US 6,380,622 B1
(45) Date of Patent: Apr. 30, 2002

(54) ELECTRIC APPARATUS HAVING A CONTACT INTERMEDIARY MEMBER AND METHOD FOR MANUFACTURING THE SAME

(75) Inventors: Yasuyoshi Hirai, Gamagori; Kazuhito Nomura, Nishio; Tomoatsu Makino, Okazaki; Takahiko Yoshida, Okazaki; Masahiro Shiozawa, Okazaki; Atsushi Hashikawa, Okazaki; Muneo Yorinaga, Okazaki, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/435,840

(22) Filed: Nov. 8, 1999

(30) Foreign Application Priority Data

Nov. 9, 1998 (JP) .............................. 10-317982
Jul. 27, 1999 (JP) .............................. 11-212731
Sep. 17, 1999 (JP) .............................. 11-264335

(51) Int. Cl.$^7$ ..................... H01L 23/29; H01L 23/48; H01L 23/32; H05K 7/20; B22B 9/00

(52) U.S. Cl. ................ 257/712; 257/688; 257/689; 257/618; 257/795; 257/796; 257/788; 257/700; 257/701; 257/738; 257/778; 428/323; 428/324; 361/708; 361/746; 361/704; 361/707

(58) Field of Search .................. 257/712, 618, 257/621, 669, 687–688, 689, 700, 701, 713, 717, 718, 726, 727, 720, 719, 737, 738, 778, 788, 789, 795, 796; 361/742, 746, 704, 705, 706, 707; 428/323, 324

(56) References Cited

U.S. PATENT DOCUMENTS 3,825,064 A * 7/1974 Inoue .................. 165/179

(List continued on next page.)

FOREIGN PATENT DOCUMENTS

JP 54-40569 3/1979

(List continued on next page.)

OTHER PUBLICATIONS

"Special Report" Electronic Technology, 1995–5, pp. 56–59.

Primary Examiner—Alexander O. Williams
(74) Attorney, Agent, or Firm—Pillsbury Winthrop LLP (57) ABSTRACT

A pressed-contact type semiconductor device in which a main electrode surface of a semiconductor element is contacted with an electrode plate by a pressed-contact, which can reduce both an electric resistance and a thermal resistance between the main electrode surface of the semiconductor element and the electrode plate. The pressed-contact type semiconductor device (100) is provided with a semiconductor element (1) having electrode surfaces, a pair of electrode plates (2) contacted with the electrode surfaces by the pressed-contact, a pair of insulating plates (3) contacted with the outer side of the pair of the electrode plates by the pressed-contact, and a pair of radiating plates (4) contacted with the outer side of the pair of the insulating plates by the pressed-contact. A contact intermediary member (5), which is made up of particle member having at least thermal conductivity and electric conductivity, is intercalated between the semiconductor element and the electrode plate. The particle member of the contact intermediary member includes large particles 5a having an average particle diameter of more than 2 μm, and small particles 5b having an average particle diameter of to or less than 2 μm. Contact intermediary members (6, 7) are intercalated into gaps generated between the electrode plate and the insulating plate, and between the insulating plate and the radiating plate so as to fill up these gaps. The contact intemediary members are made of powder material having at least thermal conductivity.

24 Claims, 5 Drawing Sheets

U.S. PATENT DOCUMENTS

| | | | |
|---|---|---|---|
| 4,141,030 A | | 2/1979 | Eisele et al. |
| 4,426,659 A | * | 1/1984 | de Bruyne et al. |
| 4,587,550 A | * | 5/1986 | Matsuda |
| 5,106,540 A | * | 4/1992 | Barma et al. ............... 252/511 |
| 5,120,665 A | * | 6/1992 | Tsukagoshi et al. |
| 5,399,432 A | * | 3/1995 | Schleifstein et al. ........ 428/403 |
| 5,527,604 A | * | 6/1996 | Hayashi ..................... 428/323 |
| 5,543,363 A | * | 8/1996 | Tokunoh et al. ............ 257/688 |
| 5,561,321 A | * | 10/1996 | Hirano et al. ............... 257/700 |
| 5,695,872 A | * | 12/1997 | Ideler et al. ................ 428/323 |
| 5,708,299 A | | 1/1998 | Teramae et al. |
| 5,781,412 A | * | 7/1998 | de Sorgo .................... 257/717 |
| 6,181,007 B1 | * | 1/2001 | Yamazaki et al. .......... 257/718 |

FOREIGN PATENT DOCUMENTS

| | | |
|---|---|---|
| JP | 54-95183 | 7/1979 |
| JP | 61-251043 | 11/1986 |
| JP | 61-265849 | 11/1986 |
| JP | 62-92349 | 4/1987 |
| JP | 62-141751 | 6/1987 |
| JP | 62-287649 | 12/1987 |
| JP | 63-96946 | 4/1988 |
| JP | 1-228138 | 9/1989 |
| JP | 3-20067 | 1/1991 |
| JP | 4-249353 | 9/1992 |

* cited by examiner

ELECTRIC APPARATUS HAVING A CONTACT INTERMEDIARY MEMBER AND METHOD FOR MANUFACTURING THE SAME

CROSS REFERENCE TO RELATED APPLICATION

This application is based upon Japanese Patent Application Nos. Hei. 10-313982 filed on Nov. 9, 1998, Hei. 11-212731 filed on Jul. 27, 1999 and Hei. 11-264335 filed on Sep. 17, 1999, the contents of which are incorporated herein by reference.

BACKGROUND OF THE INVENTION

1. Field of the Invention

This invention relates to an electric apparatus, and particularly to an electric apparatus in which an electric signal from a heat-emitting element is output through an electrode member by contacting the heat-emitting element with the electrode member, and further particularly to an electric apparatus which can reduce an electric resistance and a thermal resistance between the heat-emitting element and the electrode member, and to a method of manufacturing the same.

2. Related Art

There has proposed a pressed-contact semiconductor device in which a main electrode surface of a semiconductor element (heat-emitting element) contacts with an electrode plate (electrode member) together by being externally pressed (hereinafter, this contact is called "pressed-contact"). Such the device is known as a structure in which a first main surface of the semiconductor element such as a thyristor as a large passing current power transistor, an IGBT (Integrated Gate Bipolar Transistor) and a large capacitor diode, is bonded by brazing, soldering or the like and a second main surface of the same is contacted with an electrode plate by the pressed-contact, or a structure in which the first main surface and the second main surface are sandwiched by electrode plates.

Recently, this kind of semiconductor element has been developed to be more and more large capacity in order to increase a rated current. Therefore, it becomes necessary to reduce a contact electric resistance and a contact thermal resistance between the semiconductor element and the electrode plate, and between the electrode plate and an insulating plate or a radiating plate (heat sink) to improve a use-efficiency and a durability of the semiconductor element.

In order to comply such a request, several semiconductor devices shown in Japanese Patent Application Laid-open No. 54-40569 and No. 54-95183 have proposed. In the former applications, an intermediary member made of oil or grease in which powder metal is mixed therein is intercalated between a main electrode surface of the semiconductor element and the electrode plate, and being held by being pressed to reduce the electric and thermal contact resistances. However, since the oil or grease including the powder metal is an insulator as itself, it is difficult to sufficiently reduce the electrical resistance. Furthermore, since these chemical synthetic materials have poor thermal conductivities compared to metal, it cannot say that this structure can sufficiently reduce the thermal resistance.

On the contrary, in the latter application, an intermediary member made of powder metal layer whose particle diameter is to or less than 2 μm is intercalated between the main electrode surface of the semiconductor element and the electrode plate, and being held by being pressed to reduce the electric and thermal contact resistances. However, in this case, the number of interfaces defined among each particles whose particle diameter is to or less than 2 μm becomes remarkably large. Therefore, although each resistance (especially electric resistance) at each interface is small, the resistance as the whole of the powder metallic layer becomes large compared to that of a bulk metal having an equal thickness. Hence, it also cannot say that this structure can sufficiently reduce the electric resistance between the main electrode surface of the semiconductor element and the electrode plate.

Furthermore, another countermeasure has proposed in Japanese Patent Application Laid-open No. 8-330338. In this application, a contact intermediary member made of soft metal foil is intercalated between the main electrode surface of the semiconductor element and the electrode plate to improve an electric contact therebetween. However, since a surface roughness of the soft metal foil is so small like a mirror surface, the contact intermediary member cannot fill up a small gap caused by an asperity of the main electrode surface of the semiconductor element or the surface of the electrode plate. Therefore, it is difficult to sufficiently reduce, especially, the thermal resistance.

Such an inconvenience described the above is thought to be common among electric apparatuses (hereinafter, called "element-electrode contact type electric apparatus") in which an electric signal from a heat-emitting element is output through an electrode member by contacting the heat-emitting element with the electrode member.

Incidentally, in the element-electrode contact type electric apparatus, a thermal buffer plate is intercalated between the heat-emitting element and the electrode member in order to reduce physical damages to the heat-emitting element. Here, physical damages include such as a load concentration due to a thermal distortion between the heat-emitting element and the electrode member during making the pressed-contact, or a wear of a contact surface (especially, the surface of the heat-emitting element) due to a difference in thermal expansion. However, the electric resistance and the thermal resistance between the heat-emitting element and the electrode member become large due to the thermal buffer member intercalating therebetween.

In order to solve this inconvenience, a countermeasure, in which the electrode member has a thermal buffer function so as to reduce the number of the component parts, has proposed in Japanese Patent Application Laid-open No. 1-228138. According to this application, a metallic plate, which contacts with both an anode and a cathode of a semiconductor element, is made of molybdenum (Mo) plate whose thermal expansion coefficient is close to that of silicon (Si), which is a main material of the semiconductor element. And then, the Mo plate is also used as an electrode contacting with an external conductor so that the number of the component parts reduces.

Although such a structure needs to provide a radiating plate (heat sink) via an insulating plate at outer side of the electrode member (thermal buffer electrode member) to radiate heat externally, this application does not disclose any methods to independently take out electric current and heat emitted by the semiconductor element.

On the contrary, a insulating plate for separating a radiating path and a current path by being intercalated between the electrode member and the radiating plate is disclosed in Japanese Patent Application Laid-open No. 62-287649. In this application, a bulk ceramic is intercalated between the heat sink and the electrode terminal for outputting signal from the semiconductor element to isolate each other, and a soft metal foil is further intercalated between the ceramic plate and the heat sink so that a radiating efficiency is improved.

Therefore, it may be thought to employ the bulk ceramic as the insulating plate to be intercalated between the thermal buffer electrode member and the radiating plate. However, the thermal resistances at an interface between the electrode member and the ceramic plate and an interface between the radiating plate and the ceramic plate are not negligibly small. Furthermore, the thickness of the ceramic plate needs to have enough thickness for assembling and handling.

Therefore, it also cannot say that this structure can sufficiently reduce the thermal resistance. Hence, according to the conventional structure as described the above, it is difficult to sufficiently reduce both the electric resistance and the thermal resistance between the heat-emitting element and the electrode member, even when the thermal buffer electrode member is used as the electrode member to reduce the number of the component parts.

SUMMARY OF THE INVENTION

This invention has been conceived in view of the background thus far described and its first object is to reduce both an electric resistance and a thermal resistance between a heat-emitting element and an electrode member, which are contacted with each other.

Its second object is to reduce both an electric resistance and a thermal resistance between a heat-emitting element and an electrode member in an electric apparatus in which the heat-emitting element is sandwiched by a pair of electrode members as thermal buffer electrode member, and the electrode members are further sandwiched by a pair of radiating members.

According to the present invention, a contact intermediary member is made up with first members having a first average diameter and having an electric conductivity and a thermal conductivity, and second members having a second average diameter smaller than the first average diameter and having an electric conductivity and a thermal conductivity. In this invention, the number of interface between each large member is reduced so that an electric resistance is reduced by the first members, and total contact area is increased so that the thermal resistance is reduced by the second members having the second average diameter. Therefore, it can provide a pressed-contact type semiconductor device in which a main electrode surface of a semiconductor element is contacted with an electrode plate by a pressed-contact, which can reduce both an electric resistance and a thermal resistance between the main electrode surface of the semiconductor element and the electrode plate.

According to another aspect of the present invention, a contact intermediary member is made up with a metal foil having surfaces contacted with the heat-emitting element and the electrode member, the surfaces being deformed to increase contact areas between the heat-emitting element and the electrode member; and powder metal intercalated into gaps formed between the deformed surfaces and both the heat-emitting element and the electrode member. In this invention, electric resistance is reduced by the metal foil, and total contact area is increased so that the thermal resistance is reduced by the powder metal having. Therefore, it can provide a pressed-contact type semiconductor device in which a main electrode surface of a semiconductor element is contacted with an electrode plate by a pressed-contact, which can reduce both an electric resistance and a thermal resistance between the main electrode surface of the semiconductor element and the electrode plate.

BRIEF DESCRIPTION OF THE DRAWINGS

These and another objects, features and characteristics of the present invention will be appreciated from a study of the following detailed description, the appended claims, and drawings, all of which form parts of this application. In the drawings, same portions or corresponding portions are put the same numerals each other to eliminate redundant explanation. In the drawings:

DESCRIPTION OF THE PREFERRED EMBODIMENTS

[First Embodiment]

Figure 1:
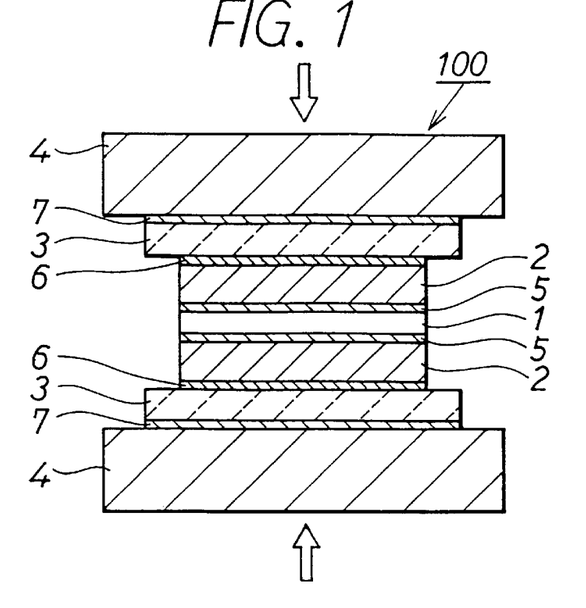
FIG. 1 is a schematic sectional view of a pressed-contact type semiconductor device of a first embodiment according to the present invention.

In this embodiment, the present invention is applied to a pressed-contact type semiconductor device as an element-electrode contact type electric apparatus. FIG. 1 is a schematic sectional view of a pressed-contact type semiconductor device 100 of this embodiment.

A semiconductor 1 is a power semiconductor element such as an IGBT and a thyristor. Both surfaces (main surface and back surface) of the semiconductor 1 (upper side is the main surface and lower side is the back surface in FIG. 1) are formed as main electrode surfaces in which a not-shown electrode made of aluminum (Al) or gold (Au), for instance, is formed. The semiconductor element 1 is sandwiched by a pair of electrode plates 2 made of molybdenum (Mo) or copper (Cu), for instance, which are provided at outer side of the both main electrode surfaces.

Furthermore, the pair of electrode plates 2 is sandwiched by a pair of insulating plate 3 made of insulating material such as aluminum nitride (AlN), for instance, which are provided outer sides of the both electrode plates 2. The pair of insulating plates 3 is sandwiched by a pair of radiating plate (heat sink) 4 made of thermal conducting material such as copper (Cu) or aluminum (Al), for instance, which are provided outer sides of the both insulating plates 3. Contact intermediary members 5, 6, 7 are intercalated between each contact portion, that is between the main electrode surface of the semiconductor element 1 and the electrode plate 2, between the electrode plate 2 and the insulating plate 3, and between the insulating plate 3 and the radiating plate 4, so as to secure thermal resistances between the main electrode surface of the semiconductor element 1 and the electrode plate 2, between the electrode plate 2 and the insulating plate 3, and between the insulating plate 3 and the radiating plate 4, and to secure electric resistances between the semiconductor element 1 and the electrode plate 2.

Each members 1–7 constructed as a multilayer structure are contacted with each other by a pressed-contact by being applied a predetermined contact pressure toward directions as shown in FIG. 1 by a not-shown pressure applying apparatus. Here, "pressed-contact" means a contact by being applied a pressure so that materials to be contacted are sandwiched. The electric signal is taken out from the lower electrode plate 2 through the upper electrode plate 2 and the semiconductor element 1 so as to perform as a so-called vertical type power element.

Next, the contact intermediary member 5, which is intercalated between the main electrode surface of the semiconductor element 1 and the electrode plate 2 will be explained.

Figure 2A:
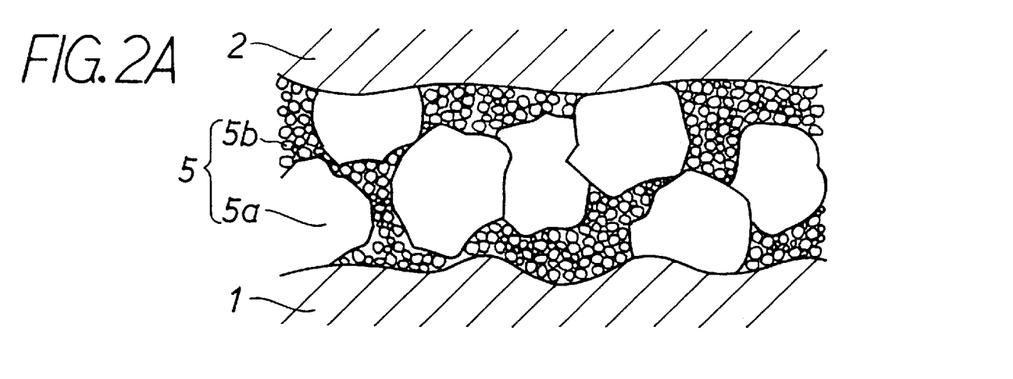
FIGS. 2A, 2B, 2C are schematic diagrams illustrating a distinctive structure of a contact intermediary member of the first embodiment.
Figure 2B:
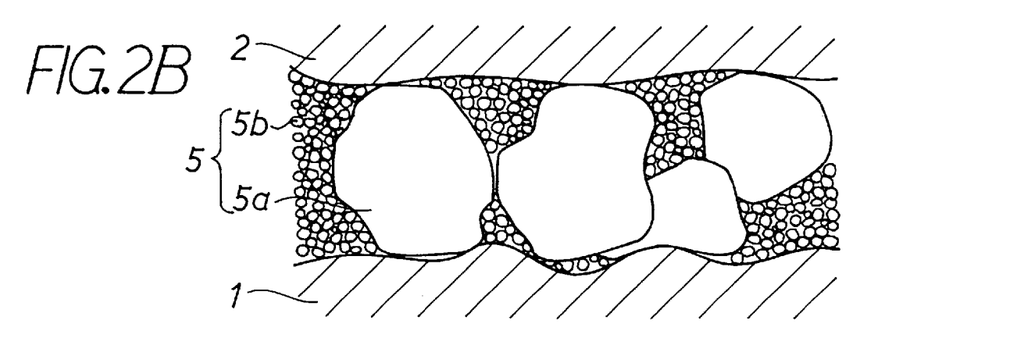

First of all, a basis to intercalate the intermediary member will be briefly explained. TABLE 1 shows relative comparison data of the electric resistance (contact electric resistance) and the thermal resistance (contact thermal resistance) between the following two cases. That is, one case is, as shown later in FIG. 2C, that there is no intercalary member between the main electrode surface of the semiconductor element 1 and the electrode plate 2 when a surface electrode of the semiconductor element 1 is made of aluminum (Al) whose surface roughness Ra is approximately 0.2 $\mu$m and the electrode plate 2 is made of molybdenum (Mo) whose surface roughness Ra is approximately 0.05 $\mu$m. Another case is that, as shown in FIG. 2A or 2B, gold (Au) powder whose average particle diameter is within a range of 50 to 100 $\mu$m is intercalated therebetween with an amount of 20 mg/cm$^2$ as the powder metal, and the semiconductor element 1 is pressed from both the electrode plate 2 sides by a pressure of 50 kgf/cm$^2$ by a not-shown pressure applying apparatus.

TABLE 1

|  | ELECTRIC RESISTANCE | THERMAL RESISTANCE |
|---|---|---|
| WITHOUT POWDER METAL | 1 | 1 |
| WITH POWDER METAL | 0.196 | 0.663 |

As can be understood from the TABLE 1, both the electric resistance and the thermal resistance can be reduced by intercalating the Au powder. The reason is as follows. In the case there is no Au powder, gaps are generated between the surface electrode of the semiconductor element 1 and the electrode plate 2 due to an asperity or a bending of each surface. In this case, a total contact area therebetween reduces so that both the electric resistance and the thermal resistance increase. On the contrary, in the case there is Au powder, the Au powder fills up the gaps due to the asperity or the bending so that that both the electric resistance and the thermal resistance can decrease.

FIGS. 2A, 2B show schematic diagrams illustrating a distinctive structure of a contact intermediary member 5 of this embodiment. Two or more kinds of particles 5$a$, 5$b$ whose average particle diameters are different from each other as the contact intermediary member 5 are intercalated between the main electrode surface of the semiconductor element 1 and the electrode plate 2. That is, large particles (first particle member) 5$a$ as a particle member, and small particles (second particle member) 5$b$ as filler whose average particle diameter is smaller than that of the large particles 5$a$ are intercalated therebetween. Each of the particles 5$a$, 5$b$ is made of a particle having thermal conductivity and electric conductivity.

Figure 2C:
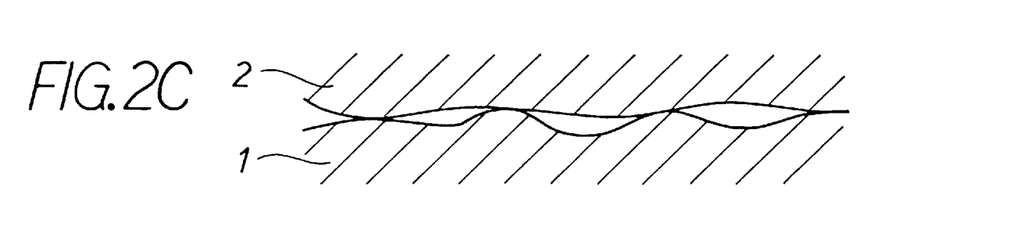

Here, FIG. 2B shows an example in which the average particle size of the large particle 5$a$ is larger than that in FIG. 2A. FIG. 2C shows an example without the contact intermediary member 5. In FIGS. 2A, 2B, although the particle diameter of the each large particle 5$a$ is slightly different one another in each figures, this embodiment can regard such large particles 5$a$ to have substantially the same particle diameter (substantially a predetermined diameter) even there is slightly difference in particle diameter.

After mixing the large particle 5$a$ and the small particle 5$b$ having different average particle diameter, the mixture is intercalated, and the semiconductor element 1 and the electrode plate 2 are pressed to form the pressed-contact. In this way, the number of the interface between each particle, which has a large electric resistance, is reduced by the large particles 5$a$. As a result, electric conduction path having a small interface resistance is generated so that the electric resistance between the semiconductor element 1 and the electrode plate 2 can reduce. On the contrary, the gaps between each large particle 5$a$ are filled up with the small particles 5$b$ so that the total contact area can be increased and the thermal resistance can be reduced.

As shown in FIGS. 2A and 2B, some of the contact area among the large particles 5$a$ may similar to a point contact depending on its shape. Since the electric resistance mainly depends on the number of contact portions (contact interface among each particles) but not the contact area, the electric resistance does not increase so much. That is, the small particles do not have to be perfectly filled up the gaps among the large particles 5$a$, and it is acceptable at least the small particles 5$b$ whose average particle diameter is smaller than that of the large particles 5$a$ exist in the gaps among the large particles 5$a$.

The average particle diameter of the small particles 5$b$ is not limited to the example values described latter as long as the average particle diameter of the small particle 5$b$ is smaller than that of the large particles 5$a$ enough to fill up the gaps among the large particles 5$a$. Furthermore, several kinds of particles (not-shown) whose average particle diameters are different from each other and smaller than that of the large particles 5$a$ can be intercalated in the gaps among the large particles 5$a$ in addition to the small particles 5$b$.

According to experimental results, the number of the interfaces generated by particles whose particle diameter is to or small than 2 $\mu$m becomes large. Therefore the number of the interfaces among the particles can reduce so that the electric resistance can reduce by setting an average particle diameter of the large particle 5$a$ to more than 2 $\mu$m and an average particle diameter of the small particle 5$b$ to equal to or less than 2 $\mu$m. Here, it is preferable to set a minimum particle diameter of the large particle 5$a$ to more than 2 $\mu$m and a maximum particle diameter of the small particle 5$b$ to equal to or less than 2 $\mu$m. Furthermore, it is preferable to employ the small particles 5$b$ whose average particle diameter is smaller than a surface roughness Ra of the electrode, because such small particles 5a can fill up an asperity of the contact surface so that the substantial contact area can increase.

Here, the large particles 5a can be made of one or more materials having the thermal conductivity and the electric conductivity selected from such as Au, Ag, Sn, Al, Cu, Pt, Ni, Ti, C, Pb, Cr, Mo, W, solder and compound of some of these metals (these metal group is called "material group A" hereinafter), and so does the small particles 5b. The material of the large particles 5a may or may not be the same as that of the small particles 5b.

Figure 3:
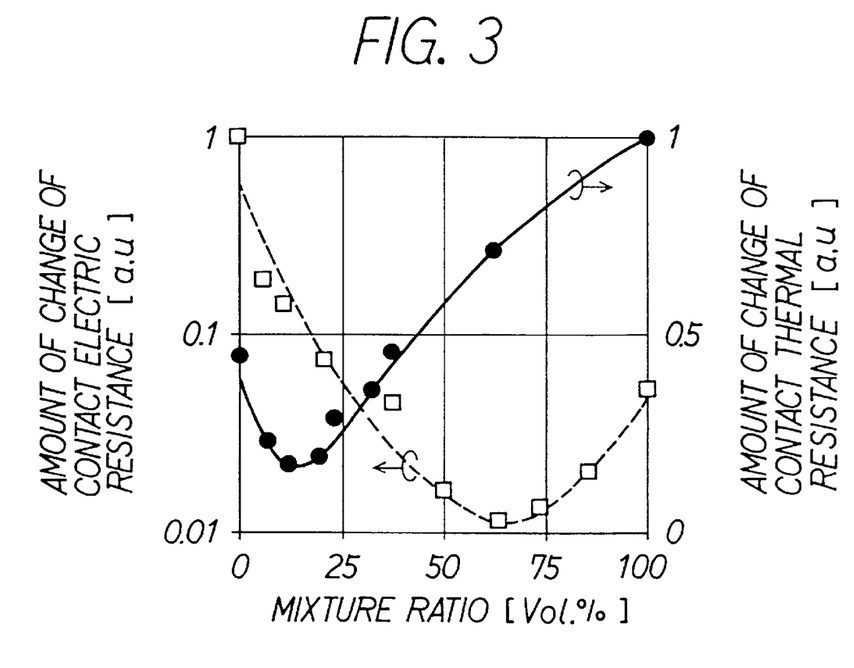
FIG. 3 is a graph illustrating relationships between a mixture ratio and changes of contact electric resistance and between the mixture ratio and changes of contact thermal resistance of the first embodiment.

FIG. 3 shows an experimental result illustrating relationships between a mixture ratio of the large particles 5a for total volume of the large and small particles 5a, 5b and changes of the contact electric resistance (□) of the contact intermediary member 5, and between the mixture ratio and changes of the contact thermal resistance (●) of the contact intermediary member 5. In detail, FIG. 3 shows changes of the electric resistance and the thermal resistance with respect to changes of volume ratio of the large particles 5a in the total volume of the particles 5a, 5b where the surface electrode of the semiconductor element 1 is made of Al (surface roughness Ra is 0.2 $\mu$m), the electrode plate 2 is made of Mo (surface roughness Ra is 0.05 $\mu$m). The contact intermediary member 5 is made of the mixture of Ag powder (as the small particles 5b) whose average particle diameter is to or smaller than 2 $\mu$m and Ag powder (as the large particles 5a) whose average particle diameter is within a range of 50 to 100 $\mu$m, and is intercalated with an amount of 30 mg/cm$^2$. Finally, multilayered members are contacted with each other by a pressed-contact by being applied a predetermined contact pressure by a not-shown pressure applying apparatus.

In FIG. 3, the constant electric resistance is normalized to 1 with a value in which the volume ratio of the large particles 5a is 0 Vol. % (volume percentage). Similarly, the constant thermal resistance is normalized to 1 with a value in which the volume ratio of the large particles 5a is 100 Vol. %. As can be understood from FIG. 3, each resistance can be reduced by adjusting the volume percentage of the two different powder metals.

According to FIG. 3, the contact thermal resistance reduces to less than half of the maximum when the volume ratio of the large particles 5a is within a range of 0 to approximately 45 Vol. %. The contact electric thermal resistance reduces to less than half of the maximum when the volume ratio of the large particles 5a is within a range of approximately 5 to 100 Vol. %, reduces to less than 0.1 when the volume ratio is a range of approximately 15 to 100 Vol. %. Therefore, it is preferable to set the volume ratio of the large particles 5a within approximately 5 to approximately 45 Vol. %, and further preferable to set the volume ratio of the large particles 5a within approximately 15 to approximately 30 Vol. % to largely reduce both the electric resistance and the thermal resistance. However, the present invention is not limited to the above-described values.

In this embodiment, when the average particle diameter of the small particles 5b is 2 $\mu$m, the average particle diameter of the small particles 5b is approximately within a range of 1/50 to 1/25 of that of the large particles 5a. Similarly, when the average particle diameter of the small particles 5b is 1.5 $\mu$m, 1 $\mu$m, 0.5 $\mu$m, the average particle diameter of the small particles 5b is approximately within a range of 3/200 to 3/100, 1/100 to 1/50, 1/200 to 1/100, respectively, of that of the large particles 5a.

In this way, according to this embodiment, it can provide the pressed-contact type semiconductor device as the element-electrode contact type electric apparatus, which can reduce both an electric resistance and a thermal resistance between the semiconductor element 1 (as the heat-emitting element) and the electrode plate 2 (as the electrode portion) by intercalating the contact intermediary member 5 made up of the large particles 5a and the small particles 5b between the semiconductor element 1.

Here, in this embodiment, the radiating plate 4 is pressed-contacted on the electrode plate 2 at a surface opposite to a pressed-contact surface with the main electrode surface with the insulating plate 3 interposed therebetween. Furthermore, the contact intermediary members 6, 7 are intercalated between the electrode plate 2 and the insulating plate 3, and between the insulating plate 3 and the radiating plate 4. Although mainly the thermal resistance is likely to increase at these interfaces, the thermal resistances at these interfaces can be reduced because the contact intermediary member 6, 7 are kinds of thermal conductive member such as powder metal (e.g., Ag or Au) filled up in the gaps of these interfaces.

TABLE 2 shows an experimental result of the contact intermediary member 6 filled up in the gaps between the electrode plate 2 and the insulating plate 3. In this case, one case is that there is the contact intermediary member 6 between the electrode plate 2 and the insulating plate 3 where the electrode plate 2 is made of molybdenum (Mo) whose surface roughness Ra is approximately 0.05 $\mu$m; the insulating plate 3 is made of aluminum nitride (AlN) whose surface roughness Ra is approximately 0.2 $\mu$m; the contact intermediary member 6 including Au powder whose average particular diameter is to or less than 2 $\mu$m is intercalated therebetween with an amount of 20 mg/cm$^2$; and the semiconductor element 1 is pressed from both the electrode plate 2 sides by a pressure of 50 kgf/cm$^2$. Another case is that, there is no powder metal (Au powder) as the contact intermediary member 6. As shown in TABLE 2, the thermal resistance with the Au powder can be largely reduced compared to that without Au powder.

TABLE 2

| | THERMAL RESISTANCE |
|---|---|
| WITHOUT POWDER METAL | 1 |
| WITH POWDER METAL | 0.187 |

The semiconductor device 100 having thus structure is manufactured by the following steps. That is, after the contact intermediary members 5, 6, 7 made of both particulars 5a, 5b are intercalated between each member 1–4, the multilayered members 1–4 are contacted with each other by a pressed-contact by being applied a predetermined contact pressure from both sides of the pair of the radiating plates 4 by a not-shown pressure applying apparatus. Here, a method of intercalating the contact intermediary member 5 will be explained.

At first, both particles 5a, 5b are weighted by a predetermined volume ratio, are added to volatile solvent such as organic solvent, and are mixed to make paste. This paste is spread on at least one of the main electrode surface of the semiconductor element 1 and the electrode plate 2. The members 1–7 are laminated as described the above. The laminated members are pressed. The volatile solvent is removed by heating (e.g., 200° C.) or air-drying the paste. In this way, only both particles 5a, 5b remains as the contact intermediary member 5.

According to this intercalating method, manufacturing efficiency will be improved, because the contact intermediary member 5 can be intercalated between the main electrode surface of the semiconductor 1 and the electrode plate 2 by using such a simple step in which after the paste is made by using the particles 5a, 5b, the paste is spread and dried.

Here, the contact intermediary member may be intercalated by the following step. That is, the particles 5a, 5b are mixed as powder mixture. The mixture is formed into a solid member by being compressed by a low pressure lower than the contact pressure. The solid member is intercalated between the main electrode surface of the semiconductor element 1 and the electrode plate 2. Finally, the laminated structure including the solid member is compressed by the contact pressure.

Another modification of the intercalating method will be explained hereinafter. In the case where a surface electrode of the semiconductor element 1 is made of aluminum (Al) whose surface roughness Ra is approximately 0.2 $\mu$m and the electrode plate 2 is made of molybdenum (Mo) whose surface roughness Ra is approximately 0.05 $\mu$m, gold (Au) powder whose average particle diameter is to or less than 2 $\mu$m (small particles 5b) and gold (Au) powder whose average particle diameter is within a range of 50 to 100 $\mu$m (large particles 5a) are mixed to make mixture of an amount of 30 mg/cm$^2$ as the contact intermediary member 5.

Next, the mixture powder is sandwiched between a pair of not-shown flat plates. This sandwich structure is previously pressed by a pressure of 5 kgf/cm$^2$ by a not-shown pressure applying apparatus so as to solidify the mixture powder to a solid member. After the solid member is intercalated between the surface electrode of the semiconductor 1 and the electrode plate 2, the semiconductor element 1 is pressed from both the electrode plate 2 sides by a pressure of 50 kgf/cm$^2$ by the pressure applying apparatus so that the solid member is intercalated as the contact intermediary member 5.

According to this modified intercalating method, handling is facilitated so that the working efficiency increases because the particles 5a, 5b are mixed to form the solid member. Furthermore, the pressure to form the solid member is set smaller than contact pressure, and the solid member is pressed again by the contact pressure after being intercalated. Therefore, the contact area is increased as a result of deforming of the solid member so that the electric resistance and the thermal resistance reduce.

The intercalating method of the contact intermediary member 5 is not limited to the above-mentioned two methods. That is, the powder type mixed particles 5a, 5b may be directly spread on the intercalating portion. Furthermore, the contact intermediated member 6, 7 made of the powder metal such as Ag or Au can be intercalated by using the intercalating method of the contact intermediary member 5.

Figure 4:
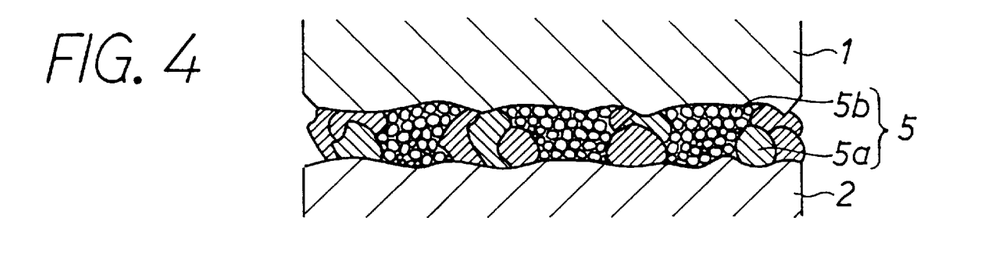
FIG. 4 is a schematic diagram illustrating a distinctive structure of a modified contact intermediary member of the first embodiment.

FIG. 4 is a schematic diagram illustrating a modified contact intermediary member of this embodiment. In the above-described embodiment shown in FIG. 2A or 2B, the contact intermediary member 5 is made by previously mixing the two different diameter particles 5a, 5b, however, the contact intermediary member 5 may not be made by previously mixing two different diameter particles 5a, 5b. That is, as shown in FIG. 4, the large particles 5a and the small particles 5b are positioned on surface of one of the semiconductor element 1 and the electrode plate 2 at least one places, respectively. After that, the lamination of the semiconductor 1 and the electrode plate 2 are contact by the pressed-contact. This method can achieve similar result as the above-described embodiment. Here, each space between the large particles 5a corresponds to the gap among the large particles 5a.

[Second Embodiment]

Figure 5:
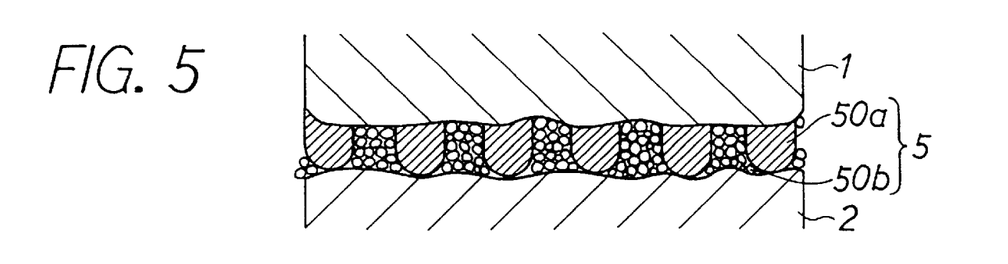
FIG. 5 is a schematic diagram illustrating a distinctive structure of a contact intermediary member of a second embodiment according to the present invention.

As shown in FIG. 2, regarding the contact intermediary member 5 to be intercalated between the semiconductor element (heat-emitting element) 1 and the electrode plate (electrode member) 2, a bump 50a having a predetermined diameter and provided at least one of the semiconductor element 1 and the electrode plate 2 is employed instead of the large particles 5a in the first embodiment. The bump 5a can be manufactured by conventional method by using solder alloy (e.g., reflowing solder balls), and has thermal conductivity and electric conductivity.

The semiconductor element 1 and the electrode plate 2 are contacted each other with the pressed-contact via a plurality of bumps 50a. Particles (particle member, fill-up member) 50b, which have the thermal conductivity and the electric conductivity and have an average particular smaller than the predetermined diameter of the bump 5a, are intercalated into gaps between each bump 50a. In this way, the contact intermediary member 5 of this embodiment is constructed by intercalating the particles 50b between the bump 50a. The bump 50a and the particles 50b can be made of the material group A described in the first embodiment.

Here, two or more kinds of not-shown particles whose average particle diameters are different from each other and smaller than the predetermined diameter of the bump 5a are intercalated among the bumps 5a in addition to the particles 50b. Furthermore, the particles 50b do not have to be perfectly filled up the gaps among the bumps 50a, and it is acceptable at least the particles 5b whose particle diameter is smaller than that of the bumps 5a exist in the gaps among the bumps 5a.

As a result, electric conduction path is generated so that the electric resistance between the semiconductor element 1 and the electrode plate 2 can reduce. On the contrary, the gaps between each bump 5a are filled up with the particles 5b so that the total contact area can be increased and the thermal resistance can be reduced.

Thus, according to this embodiment, it can provide the pressed-contact type semiconductor device as the element-electrode contact type electric apparatus, which can reduce both the electric resistance and the thermal resistance between the semiconductor element 1 and the electrode plate 2.

[Third Embodiment]

Figure 6:
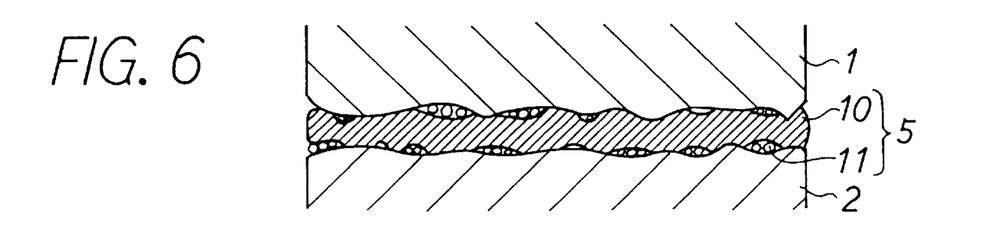
FIG. 6 is a schematic diagram illustrating a distinctive structure of a contact intermediary member of a third embodiment according to the present invention.

As shown in FIG. 6, a metal foil 10 whose surface is deformed is intercalated between the semiconductor element (heat-emitting element) 1 and the electrode plate (electrode member) 2 to increase the contact area between the semiconductor element 1 and the electrode plate 2. A powder metal 11 is filled into gaps generated by the metal foil 10 so that the contact intermediary member is formed by the metal foil 10 and the powder metal 11. The metal foil 10 and the powder metal can be made of materials selected from the material group A in the first embodiment.

The metal foil 10 to be intercalated between the semiconductor element 1 and the electrode plate 2 has an asperity on the whole surface, which is formed by intentionally roughening the surface by using wet etching, dry etching, grinding, polishing with polishing material such as polishing paper, by forming creases, or bending. In this way, the asperity of the surface fits a small asperity of the electrode surface of the semiconductor element 1 or the electrode plate 2 so that it can obtain enough contact area.

In the case of this embodiment, as well as the first and the second embodiments, the powder metal 11 does not have to be perfectly filled up the gaps among the gaps generated by the metal foil 10 having the asperity, and it is acceptable at least the powder metal 11 exists in the gaps among the gaps generated by the metal foil 10. Here, the powder metal 11 may be made of plural kinds of particle members (not-shown) whose (average) particle diameters are different from each other. According to this embodiment, since the metal foil 10 achieves the same result as that of the large particles 50a or the bump 50a, and the powder metal 11 achieves the same result as that of the (small) particles 50b, the element-electrode contact type electric device which can achieve the object of the present invention can be provided.

According to this embodiment, the intercalation of the contact intermediary member 5 between the semiconductor element 1 and the electrode plate 2 can spread a contact pressure onto the whole surface of the semiconductor element 1 so that it can increase a contact withstand pressure of the element, as well as reduce the contact electric resistance and the contact thermal resistance. For example, in the case of element described as "whit powder metal" in TABLE 1, the contact withstand pressure, which causes the element breakdown, can be increased as twice as that of "without powder metal" in TABLE 1.

[Fourth Embodiment]

Figure 7:
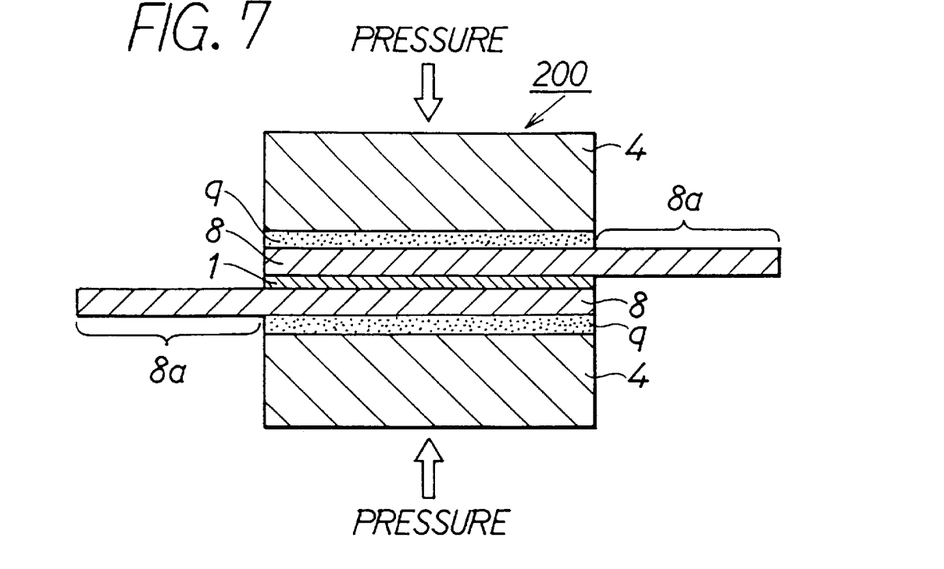
FIG. 7 is a schematic sectional view of a pressed-contact type semiconductor device of a fourth embodiment according to the present invention.

FIG. 7 is a schematic sectional view of a pressed-contact type semiconductor device 200 of a fourth embodiment according to the present invention. This embodiment employs a thermal buffer electrode member.

A semiconductor device 200 is provided this a semiconductor element (heat-emitting element) 1, a pair of thermal buffer electrode members (hereinafter, called simply "electrode plate") 8, which support the semiconductor device 1 by sandwiching the both main electrode surfaces (main surface and back surface) of the semiconductor device 1, and a pair of radiating plate (radiating member) 4, which are disposed outer side of the electrode plates 8 and support the electrode plates 8 by sandwiching the electrode plates 8. The laminated the members 1, 4, 8 pressed-contact with each other by being applied a predetermined contact pressure (e.g., 100 kg/cm2) from both outer side of the pair of the radiating plates 4 as shown by arrows in FIG. 7.

Here, the pair of the electrode plates 8 is made of molybdenum, tungsten or the like, and is constructed as electrode member having a thermal buffer function for buffering heat from the semiconductor element 1 and an electrode function for taking out electrode signals from the semiconductor element 1. Here, projected portions of the electrode plates 8 are electrode taking-out portion to be connected with not shown outer terminals. The electrode taking-out portion may connect with the outer electrode by screw, crimp contact, soldering, wire bonding or the like.

An insulating layer 9 made of insulating material is integrally formed on a surface, which faces the radiating plate 4, of the each electrode plate 8. The insulating layer 9 may be made of a material selected from a group of $Al_2O_3$, $SiO_2$, SiN, AlN, SiC, DLC (diamond like carbon), or the like. This material is formed on the material of the electrode plate 8 such as molybdenum (Mo), tungsten (W) or the like by vacuum deposition, spatter, CVD (chemical vapor deposition), thermal spraying, printing or the like.

The insulating layer 9 integrally formed with the electrode plate 8 may be manufactured by the following method. That is, the surface of the Mo, W or the like, where the insulating layer is to be formed, is partially covered (masked) by organic material or inorganic material. After that, molybdenum oxide film, tungsten oxide film or the like is formed of the surface of the electrode plate 8 by using a thermal oxidation or the like to as to integrally form the electrode plate 8 and the insulating layer 9. The thickness of the insulating layer 9 integrally formed with the electrode plate 8 is preferably selected from a range of 1 to 10 $\mu$m according to an empirical knowledge for both insulating basis and low-thermal resistance basis.

In the semiconductor device 200 constructed the above, the current path is formed so that current from external flows from the upper electrode taking-out portion 8a of the upper electrode plate 8 to the lower electrode taking-out portion 8a of the lower electrode plate 8 through the semiconductor element 1. Thus, the electric signal of the semiconductor element 1 is taken out to the external through the electrode plate 8. The radiating path is formed so that heat generated by the semiconductor element 1 is externally radiated from each radiating plate 4 through the upper and lower electrode plates 8 and each insulating layer 9.

According to this embodiment, since a contact interface between the electrode plate 8 and the insulating layer 9 is fined by forming the insulating material on the surface of the electrode plate 8 as the insulating layer 9, the gaps generated between the contact interface can be reduced compared to those of conventional structure in which bulk electrode member and bulk insulating member are contacted each other with the directly pressed-contact so that the thermal resistance at the contact interface between the electrode plate 8 and the insulating layer 9 can be largely reduced. Therefore, both the electric resistance and the thermal resistance between the semiconductor element 1 and the electrode plate 8 can be reduced.

According to the method of forming the insulating layer 9 using the vacuum deposition, thermal oxidation or the like, the insulating layer 9 can easily formed on the electrode plate 8 independently of the shape of the electrode plate 8 so that the degree of freedom of the shape of the electrode plate 8 increases. In other words, the shape of the electrode plate 8 does not need to be a flat plate. As a result, the degree of freedom of the shape of the semiconductor device 200 can be increased.

Figure 8:
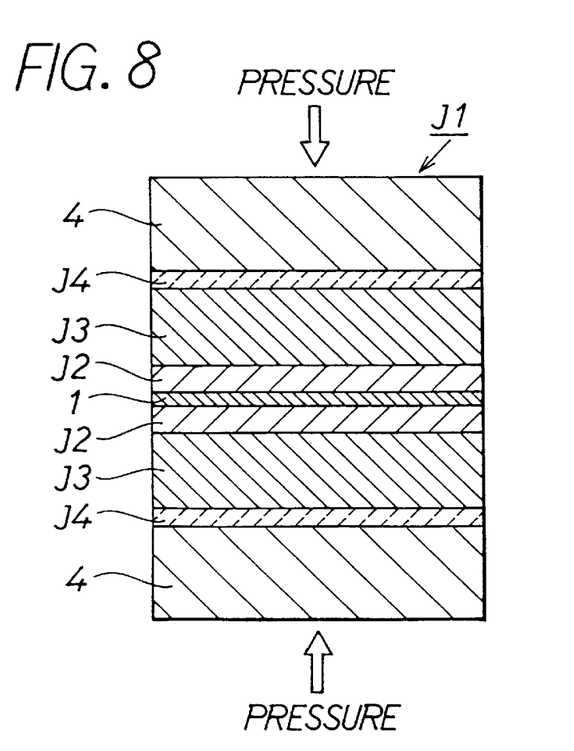
FIG. 8 is a schematic sectional view of a pressed-contact type semiconductor device according to the related art.

Furthermore, according to this embodiment, it can achieve the result of using the thermal buffer electrode member 8. FIG. 8 shows a pressed-contact type semiconductor device J1 of the related art in which the thermal buffer electrode member is not employed. In detail, the semiconductor device J1 shown in FIG. 8 is the pressed-contact type semiconductor device in which the semiconductor element 1 is sandwiched by a pair of thermal buffer plates J2 made of Mo or W from the upper and lower sides, the thermal buffer plates J2 are sandwiched by a pair of electrode plates J3 made of copper or the like from the upper and lower sides, and the electrode plates J3 are sandwiched by a pair of radiating plates 4 with insulating plates J4 made of aluminum nitride or the like interposed therebetween.

According to this semiconductor device 200, since the number of the contact interface can be reduced by using the thermal buffer electrode plate 8 so as to reduce the number of the component parts, it can reduce the bulk resistance of the components and the contact interface resistance among the components. In detail, in the case of the semiconductor device J1 shown in FIG. 8, the number of the contact interfaces is reduced from two to one on the current path, and from four to two on the radiating path. Since an absolute value of the contact interface resistance among the component parts is large compared to that of bulk resistance of the component parts, the electric resistance and the thermal resistance can be largely reduced by reducing the number of contact interfaces.

TABLE 3 shows a merit of the semiconductor device 200 by comparing the semiconductor device J1 of the related art shown in FIG. 8. Here, the semiconductor device of the related art employs the insulating plate J4 made up with a bulk plate made of aluminum nitride whose thickness is 0.625 mm, and the semiconductor device 200 of this embodiment employs the insulating layer 9 made of aluminum nitride formed by spatter and having a thickness of 2 a m. The contact pressure of both semiconductor devices J1 and 200 are commonly 100 kg/cm$^2$.

TABLE 3

|  | ELECTRIC RESISTANCE | THERMAL RESISTANCE |
| --- | --- | --- |
| RELATED ART | 1 | 1 |
| FOURTH EMBODIMENT | 0.140 | 0.213 |

As can be understood from the TABLE 3, both the electric resistance and the thermal resistance of this embodiment are reduced as a result of reducing the insulating layer 9 integrally formed on the thermal buffer electrode plate 8 and a result of reducing the number of component parts. Thus, since the pressed-contact semiconductor device can be manufactured as a large capacity device by reducing both the electric resistance and the thermal resistance, the number of the semiconductor element 1 per one module can be reduced so that a cost of the whole device can be lowered.

Here, the insulating layer 9 is integrally formed with the thermal buffer electrode plate 8 in this fourth embodiment; however, the insulating layer 9 may be formed on the radiating plate (heat sink) 4 as the radiating device at a surface which is to be contacted with the electrode plate 8 by the vacuum deposition or the like. This structure can achieve the same result as that of fourth embodiment. Here, the radiating member made of thermal conductive material such as copper, aluminum or the like is generally formed thicker or larger than the electrode plate in order to enhance the radiating ability. Therefore, it is preferable to form the insulating layer 9 on the electrode plate 8 from a viewpoint of mountability to a film forming apparatus such as vacuum deposition apparatus or spatter apparatus during the formation of the insulating film.

The fourth embodiment can be applied to a semiconductor device other than the pressed-contact type as shown in FIG. 7 as well as the pressed-contact type semiconductor device. Furthermore, it is acceptable to other semiconductor device in which the heat-emitting element is sandwiched by a pair of electrode members, which have both the thermal buffer function for buffering the heat from the heat-emitting element and the electrode function for taking out the electric signals from the heat-emitting element, and the electrode members are sandwiched by a pair of radiating member from the outer side.

[Fifth Embodiment]

Figure 9:
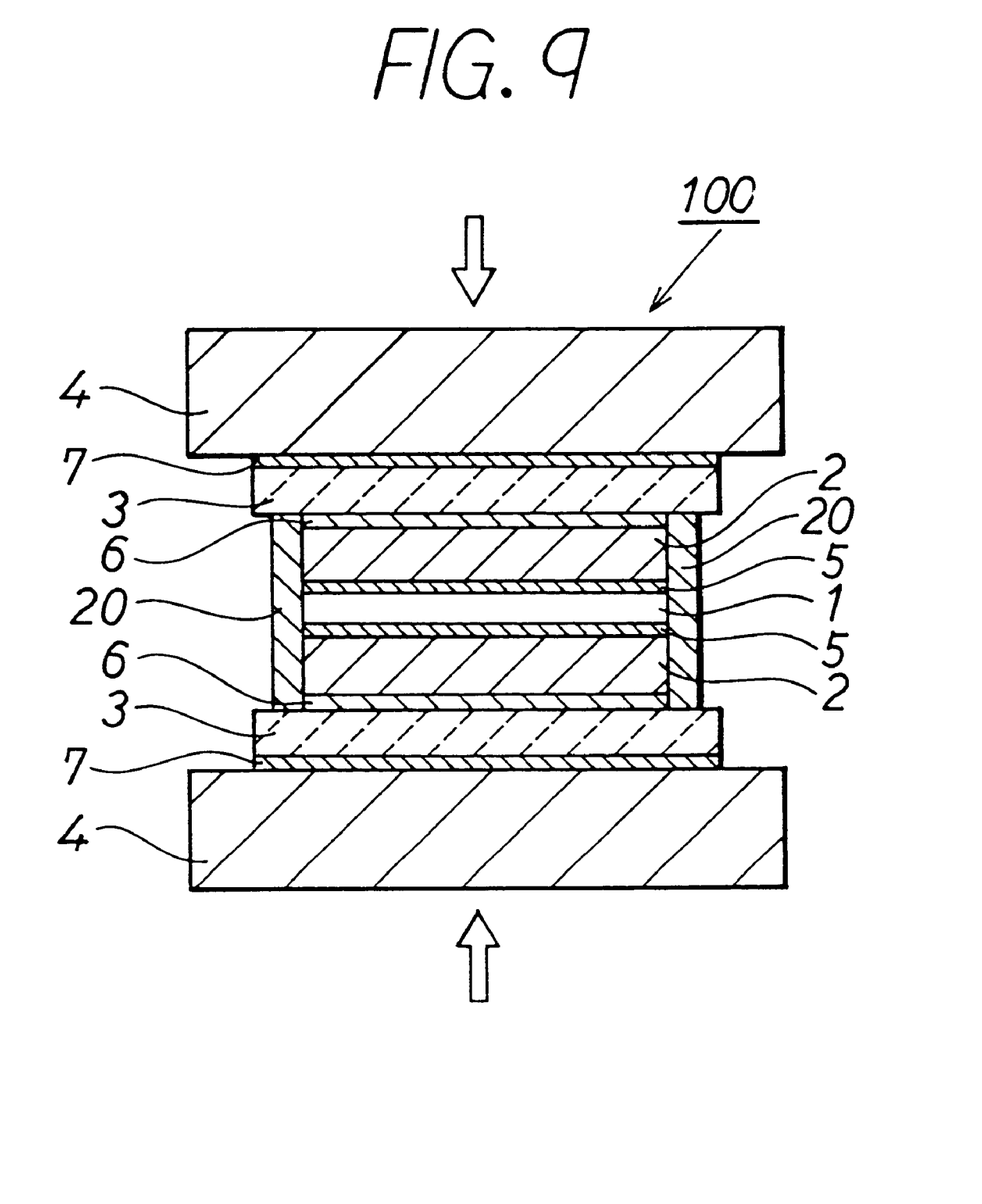
FIG. 9 is a schematic sectional view of a pressed-contact type semiconductor device of a fifth embodiment according to the present invention.

FIG. 9 is a schematic sectional view of a pressed-contact type semiconductor device 300 of a fifth embodiment according to the present invention. The pressed-contact type semiconductor device 300 is formed by adding a covering member 20 made of insulating material to the pressed-contact type semiconductor device 100 shown in FIG. 1.

In this embodiment, the covering member 20 is formed in a frame shape corresponding to an outer shape of the semiconductor element 1 and the electrode plate 2, and is provided so that an inner surface of the frame contacts with the outer peripheral surface of both the semiconductor element 1 and the electrode plate 2. Thus, the covering member 20 covers a surrounding portion of a region where the semiconductor element 1 contacts with the electrode plate 2 via the contact intermediary member 6 and a surrounding portion of a region where the electrode plate 2 contacts with the insulating plate 3 via the contact intermediary member 6. Here, the covering member 20 is bonded together to the outer peripheral surfaces of the semiconductor element 1 and the electrode plate 2.

The covering member 20 can be made of electrically insulating material such as PPS (polyphenylene sulfide), glass epoxy, free-cutting ceramic, PBT (polybutylene terephthalate) or other kinds of ceramic so as to prevent spark, short-circuit between the semiconductor element 1 and the electrode plate 2. On the viewpoint of durability, it is preferable to employ the PPS, the epoxy glass, the free-cutting ceramic when the covering member 20 is exposed at a temperature higher than approximately 150° C. due to heat emitted by the semiconductor element 1, and it may employ the PBT when the covering member 20 is exposed at a temperature up to approximately 120° C.

According to this embodiment, since the covering member 20 covers the contact intermediary members 5, 6 by providing the covering member 20, it can prevent the contact intermediary member 5, 6 formed in particles or powder from spattering (scattering) in addition to the merit of semiconductor device 100 shown in FIG. 1.

Furthermore, the frame-shaped covering member 20 is disposed so as to contact with the outer peripheral surface of the semiconductor element 1 and the electrode plate 2. Therefore, the covering member 20 acts as a guide member for alignment or positioning when the semiconductor element 1 contacts with the electrode plate 2 via the contact intermediated member 5, and as a support member for prevent the members 1, 2 from slipping toward a contact surface direction.

Here, in this embodiment, the covering member 20 is formed in the frame shape to correspond to the outer shape of the semiconductor element 1 and the electrode plate 2 so as to cover the whole outer peripheral surface of the semiconductor element 1 and the electrode plate 2, however, the covering member can be formed so that it partially covers the outer peripheral surface of them. For example, it is acceptable to cover only a region where the intermediary member 5 easily spatters by using a wall-type covering member.

[Other Modification]

In the first embodiment, the contact intermediary member 5 may be made up with three or more kinds of particles whose average particle diameters are different from each other, and each kind of particles may be made of different kinds of materials. The contact intermediary member 6, 7 may be formed as the powder metal as well as the both particles 5a, 5b other than Au or Ag, and further may be made of electric conductive foil such as a metal foil as well as the third embodiment, or carbon sheet having a thermal conductivity.

In the semiconductor device 100, it may omit the contact intermediary members 6, 7 as long as at least the contact intermediary member 5 is intercalated between the semiconductor element 1 and the electrode plate 2 in order to reduce the electric resistance and the thermal resistance between the semiconductor element 1 and the electrode plate 2. Furthermore, the contact intermediary members 6, 7 may be formed at least one of between the electrode plate 2 and the insulating plate 3, and between the insulating plate 3 and the radiating plate 4.

In the fourth embodiment, the contact intermediary member 5 described in one of the first to third embodiments may be intercalated between the semiconductor element 1 and the electrode plate 8. In this case, it can achieve the merit of the contact intermediary member 5 and the merit of the fourth embodiment. Furthermore, in the fourth embodiment, the contact intermediary member 6 as the thermal conductive member made of powder metal (Ag or Au) having the thermal conductivity described in the first embodiment may be intercalated between the electrode plate 8 and the radiating member 4. In this case, the thermal resistance can be further reduced.

The semiconductor device may be formed so that only one surface of the semiconductor element 1 is contacted with the electrode plate 2 by the pressed-contact and another surface is contacted with the electrode plate 2 by soldering or the like. In this case, the contact intermediary member 5 may be intercalated between the semiconductor element 1 and the electrode plate 2, which are contacted by the pressed-contact. The contact intermediary member 5 described in one of these embodiments may be intercalated between a heat-emitting element and an electrode member of an electric apparatus in which electric signals from the heat-emitting element are taken out through the electric member by contacting the heat-emitting element and the electrode member together, as well as the pressed-contact type semiconductor device.

What is claimed is:

1. An electric apparatus comprising:
    a heat-emitting element for outputting an electric signal and emitting heat in response to operation; and
    an electrode member contacted with the heat-emitting element with a contact intermediary member interposed therebetween and for taking out the electric signal from the heat-emitting element through the contact intermediary member,
    wherein the contact intermediary member is made up with first members and second members excluding resin,
        the first members have a first average diameter and an electric conductivity and a thermal conductivity, and
        the second members have a second average diameter smaller than the first average diameter and an electric conductivity and a thermal conductivity.

2. An electric apparatus according to claim 1, wherein the first members include first particle members formed in particle, and
    the second members include second particle members formed in particle.

3. An electric apparatus according to claim 2, wherein an average particle diameter of the first particle members is more than 2 $\mu$m, and
    an average particle diameter of the second particle members is equal to or less than 2 $\mu$m.

4. An electric apparatus according to claim 2, wherein a volume ratio of the first particle members is selected from a range of approximately 5 Vol. % to approximately 45 Vol. %.

5. An electric apparatus according to claim 2, wherein a volume ratio of the first particle members is selected from a range of approximately 15 Vol. % to approximately 30 Vol. %.

6. An electric apparatus according to claim 2, wherein the second average diameter is approximately within a range of $1/50$ to $1/25$ of the first average diameter.

7. An electric apparatus according to claim 2, wherein the second average diameter is approximately within a range of $3/200$ to $3/100$ of the first average diameter.

8. An electric apparatus according to claim 2, wherein the second average diameter is approximately within a range of $1/100$ to $1/50$ of the first average diameter.

9. An electric apparatus according to claim 2, wherein the second average diameter is approximately within a range of $1/200$ to $1/100$ of the first average diameter.

10. An electric apparatus according to claim 2, wherein the second particle members are intercalated into gaps formed between the first particle members.

11. An electric apparatus according to claim 1, wherein
    the first members include bumps formed on at least one of the heat-emitting element and the electrode member, and having the first average particle diameter, and
    the second members include particle members formed in particle having the second average particle diameter, and the particle members are intercalated into gaps formed between each of the bumps.

12. An electric apparatus according to claim 1, wherein the contact intermediary member is made of one or more materials selected from a group of Au, Ag, Sn, Al, Cu, Pt, Ni, Ti, C, Pb, Cr, Mo, W, solder and compound of some of these metals.

13. An electric apparatus according to claim 12, wherein the first members are made of one or more materials different from that of the second members.

14. An electric apparatus according to claim 1, further comprising a cover member made of insulating material, and provided on the outer peripheral portions of both the heat-emitting element and the electrode member where the heat-emitting element contacts with the electrode member via the contact intermediary member.

15. An electric apparatus according to claim 1, wherein
    the heat-emitting element includes a semiconductor element having a main electrode surface at which the electric signal is to be outputted; and
    the electrode member includes an electrode plate contacted with the main electrode surface of the semiconductor element by a pressed-contact,
    wherein the electric apparatus further comprises:
        an insulating plate contacted with the electrode plate on a surface opposite to a surface with which the main electrode surface is contacted;
        a radiating plate contacted with the insulating plate on a surface opposite to a surface with which the electrode plate is contacted; and
        one or more thermal conductive members having a thermal conductivity and disposed at least one of between the electrode plate and the insulating plate, and between the insulating plate and the radiating member.

16. An electric apparatus according to claim 1, wherein gaps formed between each of the first members are filled with the second members.

17. An electric apparatus comprising:
    a heat-emitting element for outputting an electric signal and emitting heat in response to operation;
    a pair of electrode members for sandwiching the heat-emitting element, being made of material buffering heat from the heat-emitting element, and for taking out the electric signal from the heat-emitting element;
    a pair of radiating members for sandwiching the pair of electrode members; and
    a pair of insulating layers provided between the pair of electrode members and the pair of radiating members, respectively, each of the insulating layers being integrally formed on a surface of one of the electrode member and radiating member, wherein each of the electrode members contacts with the heat-emitting element with a contact intermediary member interposed therebetween and takes out the electric signal from the heat-emitting element through the contact intermediary member, and the contact intermediary member is made up with first members and second members excluding resin, the first members have a first average diameter and having an electric conductivity and a thermal conductivity, and the second members have a second average diameter smaller than the first average diameter and an electric conductivity and a thermal conductivity.

18. An electric apparatus according to claim 17, wherein each of the insulating layers is integrally formed on the surface of electrode member.

19. An electric apparatus according to claim 17, wherein each of the insulating layers has a thickness selected from a range from 1 to 10 $\mu$m.

20. An electric apparatus according to claim 17, wherein each of the insulating layers is made of material selected from a group of $Al_2O_3$, $SiO_2$, SiN, AlN, SiC or diamond like carbon.

21. An electric apparatus according to claim 17, further comprising a pair of thermal conductive member provided between the pair of electrode members and the pair of radiating members, respectively.

22. An electric apparatus according to claim 17, wherein gaps formed between each of the first member are filled with the second members.

23. An electric apparatus comprising:

a heat-emitting element for outputting an electric signal and emitting heat in response to operation; and an electrode member contacted with the heat-emitting element with a contact intermediary member interposed therebetween and taking out the electric signal from the heat-emitting element through the contact intermediary member, wherein the contact intermediary member is made up with
first members having a first average diameter and having an electric conductivity and a thermal conductivity, and second members composed of metal and having a second average diameter smaller than the first average diameter and having an electric conductivity and a thermal conductivity.

24. An electric apparatus according to claim 23, wherein the contact intermediary member is made up with the first members and the second members excluding resin.

* * * * *